(12) United States Patent
Shamee et al.

(10) Patent No.: US 10,135,541 B1
(45) Date of Patent: Nov. 20, 2018

(54) ANALOG-TO-DIGITAL CONVERTER USING A TIMING REFERENCE DERIVED FROM AN OPTICAL PULSE TRAIN

(71) Applicant: Raytheon Company, Waltham, MA (US)

(72) Inventors: Bishara Shamee, Playa Del Rey, CA (US); Steven R. Wilkinson, Stevenson Ranch, CA (US); Makan Mohageg, Porter Ranch, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/658,048

(22) Filed: Jul. 24, 2017

(51) Int. Cl.
    *H03M 1/00*     (2006.01)
    *H04B 10/516*     (2013.01)
    *H04B 1/00*     (2006.01)

(52) U.S. Cl.
    CPC ....... *H04B 10/5161* (2013.01); *H04B 1/0003* (2013.01)

(58) Field of Classification Search
    CPC .... H03M 1/0836; H03M 1/12; H03M 1/1225; H03M 1/121; H03M 1/44
    USPC .......................................... 341/137–142, 155
    See application file for complete search history.

(56) References Cited

U.S. PATENT DOCUMENTS

| | | |
|---|---|---|
| 4,694,276 A | 9/1987 | Rastegar |
| 6,118,396 A | 9/2000 | Song |
| 6,661,361 B1 | 12/2003 | Lewis et al. |
| 8,780,948 B2 | 7/2014 | Wilkinson et al. |
| 8,787,767 B2 | 7/2014 | Wilkinson et al. |
| 9,450,597 B1* | 9/2016 | Ahmed ............... H03M 1/1245 |
| 2003/0091116 A1* | 5/2003 | Yap .......................... H03M 3/47 375/247 |
| 2004/0047640 A1* | 3/2004 | Knaack .................... G01H 9/00 398/209 |
| 2004/0141569 A1* | 7/2004 | Agazzi ............... H04B 10/2575 375/302 |
| 2008/0031633 A1* | 2/2008 | Hoshida ............... H04B 10/677 398/149 |

(Continued)

OTHER PUBLICATIONS

"U.S. Appl. No. 15/658,069, Non Final Office Action dated Nov. 1, 2017", 13 pgs.

(Continued)

*Primary Examiner* — Linh Nguyen

(74) *Attorney, Agent, or Firm* — Schwegman Lundberg & Woessner, P.A.

(57) ABSTRACT

An analog-to-digital converter can produce a digital signal representative of an analog input electrical signal. An optical amplitude modulator can modulate an input optical pulse train using the analog input electrical signal to produce a first modulated optical pulse train. An optical splitter can split the first modulated optical pulse train into a plurality of modulated optical pulse trains. A plurality of detectors can convert the plurality of modulated optical pulse trains into respective modulated voltage pulse trains. A plurality of comparators and a decoder, arranged in a flash converter topology, can receive the modulated voltage pulse trains and output the digital signal representative of the analog input electrical signal using a timing reference derived from the input optical pulse train. Using a relatively high-precision input optical pulse train, such as a Kerr Comb, can produce a relatively high-accuracy analog-to-digital converter.

15 Claims, 2 Drawing Sheets

(56) References Cited

U.S. PATENT DOCUMENTS

| | | | | |
|---|---|---|---|---|
| 2008/0075472 | A1* | 3/2008 | Liu | H04B 10/5161 398/202 |
| 2010/0142951 | A1* | 6/2010 | Armstrong | H04B 10/67 398/65 |
| 2010/0178065 | A1* | 7/2010 | Nishihara | H04B 10/61 398/202 |
| 2011/0318019 | A1* | 12/2011 | Nissov | H04B 10/2513 398/159 |
| 2012/0213531 | A1* | 8/2012 | Nazarathy | H03M 1/145 398/202 |
| 2012/0280844 | A1 | 11/2012 | Abe et al. | |
| 2013/0315597 | A1* | 11/2013 | Shaver | H04J 14/0227 398/79 |
| 2013/0328706 | A1* | 12/2013 | Marom | H03M 1/1245 341/137 |
| 2013/0328708 | A1* | 12/2013 | Raphaeli | H03M 1/12 341/155 |
| 2015/0063378 | A1* | 3/2015 | Nebendahl | H04B 10/614 370/537 |
| 2016/0220709 | A1 | 8/2016 | Olivo et al. | |

OTHER PUBLICATIONS

Chen, Xu, et al., "Photonic-assisted time-interleaved ADC based on optical delay line", Journal of Optics 18, (2016), 1-6.

Esman, Daniel, et al., "High Resolution Broadband Photonic Sampled ADC: 8.0 ENOB at 40 GHz", OECC/ACOFT, (2014), 189-191.

Grein, Matthew, et al., "Demonstration of a photonic analog-to-digital converter scalable to 40 GS/s with 8-bit resolution", CLEO/QELS, JWA90, (2008), 2 pgs.

Kewitsch, Anthony, et al., "All-fiber zero-insertion-loss add-drop filter for wavelength-division multiplexing", Optics Letters / vol. 23, No. 2, (1998), 106-108.

Khilo, Anatol, et al., "Photonic ADC: overcoming the bottleneck of electronic jitter", Optics Express, vol. 20, No. 4, (Feb. 13, 2012), 16 pgs.

Nakazawa, Masataka, et al., "1024 QAM (60 Gbps) single carrier coherent optical transmission over 150 km", Optics Express, vol. 20, No. 11, (May 21, 2012), 7 pgs.

Nejadmalayeri, Amir, et al., "A 16-fs aperture-jitter photonic ADC: 7.0 ENOB at 40 GHz", OSA/CLEO CThI4, (2011), 3 pgs.

Raybon, G, et al., "Single Carrier High Symbol Rate Transmitter for Data Rates up to 1 Tb/s", OFC, Th3A.2, (2016), 3 pgs.

Valley, George C, "Photonic analog-to-digital converters", Optics Express, vol. 15, No. 5, (2007), 28 pgs.

Yariv, A, et al., "Time Interleaved optical sampling for ultra-high speed A/D conversion", Electronic Letters, 8, vol. 34, No. 21, (Oct. 15, 199), 2012-2013.

"U.S. Appl. No. 15/658,081, Notice of Allowance dated Nov. 22, 2017".

U.S. Appl. No. 15/658,069, filed Jul. 24, 2017, High-Speed Analog-to-Digital Converter.

U.S. Appl. No. 15/658,081, filed Jul. 24, 2017, Analog-to-Digital Converter Using a Continuous-Wave Laser and a Timing Reference Derived From a Multifrequency Optical Signal.

"U.S. Appl. No. 15/658,069, Response filed Jun. 25, 2018 to Final Office Action dated Apr. 25, 2018", 8 pgs.

\* cited by examiner

ANALOG-TO-DIGITAL CONVERTER USING A TIMING REFERENCE DERIVED FROM AN OPTICAL PULSE TRAIN

FIELD OF THE DISCLOSURE

The present disclosure relates to an analog-to-digital converter.

BACKGROUND OF THE DISCLOSURE

As communication systems evolve over time, digital data rates tend to increase. As a result there is ongoing effort to improve the speed and accuracy of analog-to-digital converters.

BRIEF DESCRIPTION OF THE DRAWINGS

Corresponding reference characters indicate corresponding parts throughout the several views. Elements in the drawings are not necessarily drawn to scale. The configurations shown in the drawings are merely examples, and should not be construed as limiting the scope of the invention in any manner.

DETAILED DESCRIPTION

An optical frequency comb is an optical signal that can include a series of periodic pulses, spaced apart equally in time, which can be referred to as an optical pulse train. The spectrum of an optical frequency comb can include multiple spikes e.g., relatively sharp peaks or delta functions) that are spaced apart equally in frequency. In general, the higher the number of frequencies, the shorter the pulses. Additionally, the wider the spacing between the frequencies, the higher the pulse repetition rate.

The optical pulse train from an optical frequency comb can be used in optical applications that require relatively precise timing, such as a high-speed analog-to-digital converter. In some examples of analog-to-digital converters, described in greater detail below, an optical pulse train can provide pulses that can serve two functions. First, the pulses can provide a timing signal, which can trigger optical or electrical elements to perform a particular task. For example, the optical pulses can be formed into a clock signal, the leading edge (or trailing edge) of which can be used to trigger comparators. Second, the pulses can effectively sample an analog waveform, with the intent of producing a digital signal that can represent the analog waveform. For example, for each sample, the analog-to-digital converter can sample the analog waveform over a duration that matches the duration of a pulse in the optical pulse train.

U.S. Pat. No. 8,787,767 provides an example of an optical frequency comb that is suitable for use in the analog-to-digital converters described in detail below. The subject matter of U.S. Pat. No. 8,787,767 is hereby incorporated by reference in its entirety. The optical frequency comb described in U.S. Pat. No. 8,787,767 is but one example of an optical frequency comb; other suitable optical frequency combs can also be used. In some examples, the optical frequency comb can be a Kerr comb.

Figure 1:
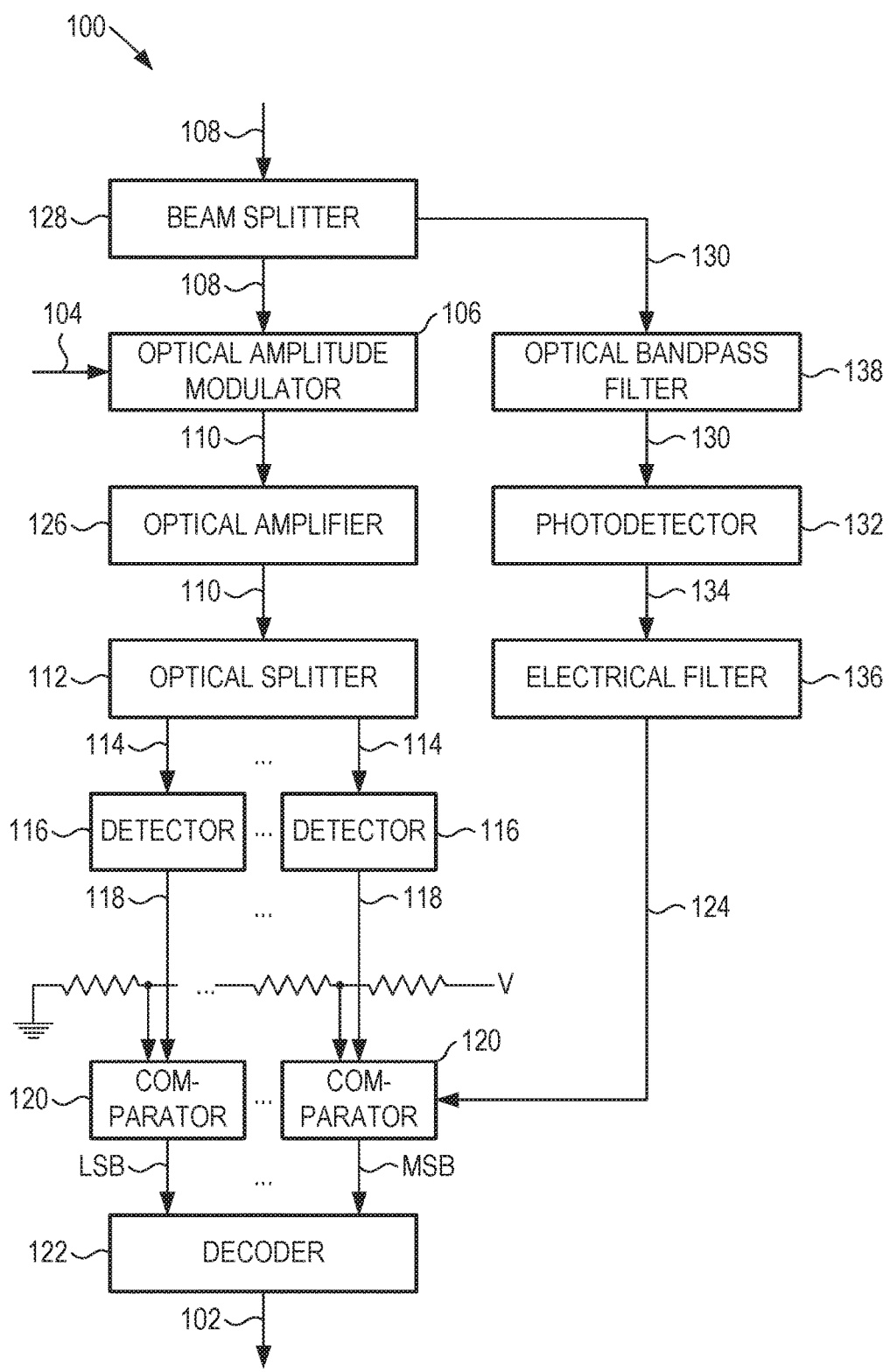
FIG. 1 shows a block diagram of an example of an analog-to-digital converter, in accordance with some examples.

FIG. 1 shows a block diagram of an example of an analog-to-digital converter 100 for producing a digital signal 102 representative of an analog input electrical signal 104, in accordance with some examples. FIG. 1 shows but one configuration of an analog-to-digital converter 100; other suitable configurations can also be used.

An input optical pulse train 108 can be provided by an optical frequency comb, as described above, or by another suitable mechanism. In the input optical pulse train 108, the pulses can be shaped and sized uniformly, from pulse-to-pulse, and spaced apart evenly in time at a constant repetition rate.

In some examples, a beam splitter 128 can split a clock optical pulse train 130 from the input optical pulse train 108. In some examples, the clock optical pulse train 130 has the same pulse repetition rate as the input optical pulse train 108. The clock optical pulse train 130, and its use in forming a timing reference 124, is discussed in detail below.

An optical amplitude modulator 106 can modulate the input optical pulse train 108 using the analog input electrical signal 104 to produce a first modulated optical pulse train 110. In some examples, the optical amplitude modulator 106 is a Mach-Zehnder interferometer configured such that the analog input electrical signal 104 operably modulates one arm of the Mach-Zehnder interferometer. Other suitable modulators can also be used.

In the first modulated optical pulse train 110, the pulse amplitude or magnitude can vary from pulse-to-pule, in a manner that matches the time-evolving amplitude or magnitude of the analog input electrical signal 104. In some examples, the repetition rate of the first modulated optical pulse train 110 can match the repetition rate of the input optical pulse train 108.

In some examples, an optical amplifier 126 can amplify the first modulated optical pulse train 110. In some examples, the optical amplifier 126 can be a semiconductor optical amplifier, which can pass current through a semiconductor gain medium to amplify light that passes through the optical amplifier. An optical amplifier 126 may have a larger bandwidth than a comparable all-electrical amplifier, which can be advantageous. Other suitable amplifiers can also be used.

An optical splitter 112 can split the first modulated optical pulse train 110 into a plurality of modulated optical pulse trains 114. In some examples, the optical splitter 112 can split the first modulated optical pulse train 110 into $2^n-1$ modulated optical pulse trains 114, where n is a number of bits representing the digital signal 102. In some examples, the modulated optical pulse trains 114 are identical to one another, to within typical manufacturing tolerances for the optical splitter 112. The modulated optical pulse trains 114 all have the same variation as one another in pulse amplitude, from pulse-to-pulse, and are in phase with one another (e.g., are synchronized to one another), from pulse-to-pulse. Using $2^n-1$ modulated optical pulse trains 114 can be compatible with a flash converter topology, which is discussed in more detail below.

A plurality of detectors 116 can convert the plurality of modulated optical pulse trains 114 into respective modulated voltage pulse trains 118. In some examples, the detectors 116 can convert the optical pulse trains into respective modulated current pulse trains. In some examples, the detectors 116 can be photodiodes, which can convert light into current. Other suitable detectors 116 can also be used. In some examples, the plurality of modulated optical pulse trains 114 are all copies of one another, the plurality of detectors 116 are all identical to one another (or as close as is practical using typical manufacturing tolerances), and the plurality of modulated voltage pulse trains 118 all have the same variation in voltage, from pulse-to-pulse, same as one another. in some examples, the plurality of detectors 116 can include $2^n-1$ detectors, where n is the number of bits for the digital signal 102.

A plurality of comparators 120 and a decoder 122 can be arranged in a flash converter topology. In a typical flash converter topology, an analog signal is applied simultaneously to each comparator, and each comparator has a different reference voltage on its other input, with the voltages ascending in voltage increments equivalent to one least significant bit. In some examples, the voltages applied to the comparators 120 in a flash converter topology can increase from the least significant bit (LSB) to the most significant bit (MSB). In some examples, including the example shown in FIG. 1, the reference voltages are provided by a chain of resistors connected in series, sometimes referred to as a resistor ladder. In these examples, the resistors are all identical to one another (or as close as is practical using typical manufacturing tolerances). In other configurations, the detectors can have a settable threshold without the resistors. In other configurations, the voltages can be provided by suitably connected capacitors. In some examples, the decoder 122 can employ thermometer code decoding, although other such decoding schemes can also be used. In some examples, the plurality of comparators 120 can include $2^n-1$ comparators, where n is the number of bits for the digital signal 102.

In some examples, the plurality of comparators 120 and the decoder 122 can receive the modulated voltage pulse trains 118 and output the digital signal 102 representative of the analog input electrical signal 104 using a timing reference 124 derived from the input optical pulse train 108. In some examples, the timing reference 124 can be a periodic electrical signal, such as a pulsed signal that corresponds to the input optical pulse train 108, a periodic signal that includes a base frequency corresponding to the repetition rate of the input optical pulse train 108 and one or more additional harmonics, or a single-frequency signal having a frequency corresponding to the pulse repetition rate of the input optical pulse train 108. In some examples, the comparators 120 can trigger comparisons synchronously with the timing reference 124. In some examples, an optical bandpass filter 138 can remove at least one frequency from the clock optical pulse train 130. In some examples, a photodetector 132 can convert the clock optical pulse train 130 to a clock electrical pulse train 134. In some examples, an electrical filter 136 can convert the clock electrical pulse train 134 to the timing reference 124. In some examples, the electrical filter 136 can be one of a bandpass filter or a low-pass filter. The timing reference 124 can have at least one frequency that corresponds to the pulse repetition rate.

In some examples, the analog-to-digital converter 100 can optionally include an additional fine delay in the optical path just before the optical amplifier 126, which can adjust for a manufacturing skew between a radiofrequency clock and a modulated signal.

Figure 2:
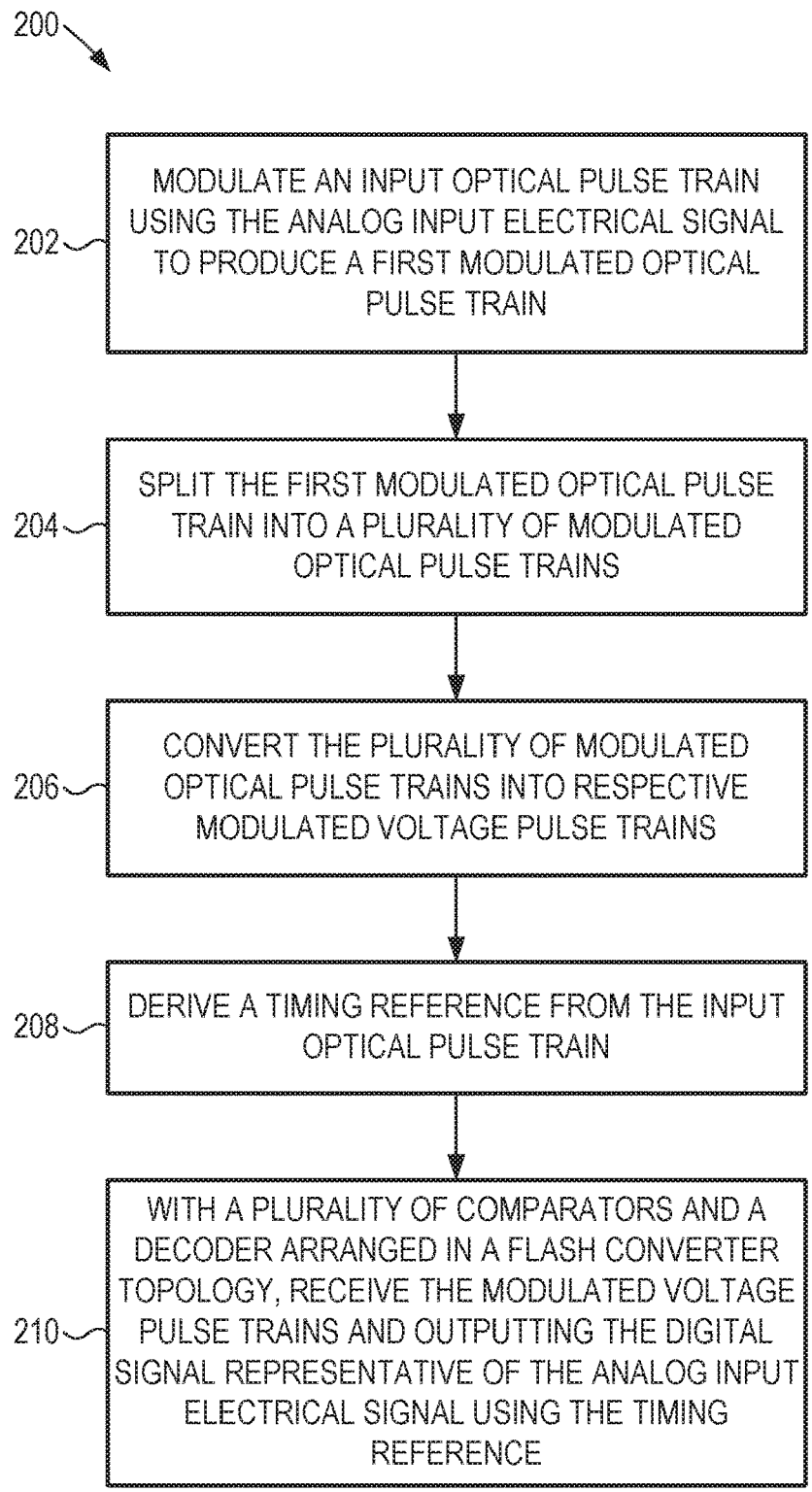
FIG. 2 shows a flowchart of a method for producing a digital signal representative of an analog input electrical signal, in accordance with some examples.

FIG. 2 shows a flowchart of a method 200 for producing a digital signal 102 representative of an analog input electrical signal 104, in accordance with some examples. The method can he executed by an analog-to-digital converter, such as 100 (FIG. 1). The method 200 of FIG. 2 is but one example of a method for producing a digital signal 102 representative of an analog input electrical signal 104; other suitable methods can also be used.

At operation 202, the analog-to-digital converter 100 can modulate an input optical pulse train 108 using the analog input electrical signal 104 to produce a first modulated optical pulse train 110. In some examples, operation 202 can further include modulating the input optical pulse train 108 with a Mach-Zehnder interferometer. In some examples, operation 202 can further include modulating one arm of the Mach-Zehnder interferometer with the analog input electrical signal 104 to produce the first modulated optical pulse train 110.

At operation 204, the analog-to-digital converter 100 can split the first modulated optical pulse train 110 into a plurality of modulated optical pulse trains 114.

At operation 206, the analog-to-digital converter 100 can convert the plurality of modulated optical pulse trains 114 into respective modulated voltage pulse trains 118.

At operation 208, the analog-to-digital converter 100 can derive a timing reference 124 from the input optical pulse train 108.

At operation 210, the analog-to-digital converter 100 can, with a plurality of comparators 120 and a decoder 122 arranged in a flash converter topology, receive the modulated voltage pulse trains 118 and output the digital signal 102 representative of the analog input electrical signal 104 using the timing reference 124.

In some examples, method 200 can further include splitting a clock optical pulse train 130 from the input optical pulse train 108. in some examples, the clock optical pulse train 130 can have the same pulse repetition rate as the input optical pulse train 108. In some examples, method 200 can further include converting the clock optical pulse train 130 to a clock electrical pulse train 134. In some examples, method 200 can further include filtering the clock electrical pulse train 134 to form the timing reference 124. The timing reference 124 can have a single frequency that corresponds to the pulse repetition rate.

While this invention has been described as having example designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An analog-to-digital converter, comprising:
   an optical amplitude modulator configured to modulate an input optical pulse train using an analog input electrical signal to produce a first modulated optical pulse train;
   an optical splitter configured to split the first modulated optical pulse train into a plurality of modulated optical pulse trains;
   a plurality of detectors configured to convert the plurality of modulated optical pulse trains into respective modulated voltage pulse trains;
   a plurality of comparators and a decoder arranged in a flash converter topology, the plurality of comparators and the decoder configured to receive the modulated voltage pulse trains and output a digital signal representative of the analog input electrical signal using a timing reference derived from the input optical pulse train;
   a beam splitter configured to split a clock optical pulse train from the input optical pulse train, wherein the input optical pulse train has a pulse repetition rate and the clock optical pulse train has the pulse repetition rate;
a photodetector configured to convert the clock optical pulse train to a clock electrical pulse train; and
an electrical filter configured to convert the clock electrical pulse train to the timing reference, the timing reference having at least one frequency that corresponds to the pulse repetition rate.

2. The analog-to-digital converter of claim 1, wherein the optical amplitude modulator is a Mach-Zehnder interferometer.

3. The analog-to-digital converter of claim 1, further comprising an optical amplifier configured to amplify the first modulated optical pulse train.

4. The analog-to-digital converter of claim 1, wherein the optical splitter is configured to split the first modulated optical pulse train into $2^n-1$ modulated optical pulse trains, where n is a number of bits for the digital signal.

5. The analog-to-digital converter of claim 4, wherein:
the plurality of modulated optical pulse trains includes $2^n-1$ modulated optical pulse trains;
the plurality of detectors includes $2^n-1$ detectors; and
the plurality of comparators includes $2^n-1$ comparators.

6. The analog-to-digital converter of claim 1, wherein the electrical filter is one of a bandpass filter or a low-pass filter.

7. The analog-to-digital converter of claim 6, wherein the timing reference has a single frequency that corresponds to the pulse repetition rate.

8. The analog-to-digital converter of claim 7, wherein the plurality of comparators are configured to trigger comparisons synchronously with the timing reference.

9. An analog-to-digital converter, comprising:
an optical amplitude modulator configured to modulate an input optical pulse train using an analog input electrical signal to produce a first modulated optical pulse train;
an optical splitter configured to split the first modulated optical pulse train into a plurality of modulated optical pulse trains;
a plurality of detectors configured to convert the plurality of modulated optical pulse trains into respective modulated voltage pulse trains;
a plurality of comparators and a decoder arranged in a flash converter topology, the plurality of comparators and the decoder configured to receive the modulated voltage pulse trains and output a digital signal representative of the analog input electrical signal using a timing reference derived from the input optical pulse train;
a beam splitter configured to split a clock optical pulse train from the input optical pulse train, wherein the input optical pulse train has a pulse repetition rate and the clock optical pulse train has the pulse repetition rate; and
an optical bandpass filter configured to remove at east one frequency from the clock optical pulse train.

10. A method for producing a digital signal representative of an analog input electrical signal, the method comprising:
modulating an input optical pulse train using the analog input electrical signal to produce a first modulated optical pulse train;
splitting the first modulated optical pulse train into a plurality of modulated optical pulse trains;
converting the plurality of modulated optical pulse trains into respective modulated voltage pulse trains;
deriving a timing reference from the input optical pulse train;

with a plurality of comparators and a decoder arranged in a flash converter topology, receiving the modulated voltage pulse trains and outputting the digital signal representative of the analog input electrical signal using the timing reference;
splitting a clock optical pulse train from the input optical pulse train, the input optical pulse train having a pulse repetition rate, the clock optical pulse train having the pulse repetition rate;
converting the clock optical pulse train to a clock electrical pulse train; and
filtering the clock electrical pulse train to form the timing reference, the timing reference having a single frequency that corresponds to the pulse repetition rate.

11. The method of claim 10, wherein the input optical pulse train comprises:
modulating the input optical pulse train with a Mach-Zehnder interferometer; and
modulating one arm of the Mach-Zehnder interferometer with the analog input electrical signal to produce the first modulated optical pulse train.

12. An analog-to-digital converter, comprising:
an optical amplitude modulator configured to modulate an input optical pulse train using the analog input electrical signal to produce a first modulated optical pulse train, the optical amplitude modulator including a Mach-Zehnder interferometer configured such that the analog input electrical signal operably modulates one arm of the Mach-Zehnder interferometer;
an optical amplifier configured to amplify the first modulated optical pulse train;
an optical splitter configured to split the first modulated optical pulse train into $2^n-1$ modulated optical pulse trains, where n is a number of bits for the digital signal;
a plurality of $2^n-1$ detectors configured to convert the plurality of modulated optical pulse trains into respective modulated voltage pulse trains;
a plurality of $2^n-1$ comparators and a decoder arranged in a flash converter topology, the plurality of comparators and the decoder configured to receive the modulated voltage pulse trains and output the digital signal representative of the analog input electrical signal using a timing reference derived from the input optical pulse train;
a beam splitter configured to split a clock optical pulse train from the input optical pulse train, the input optical pulse train having a pulse repetition rate, the clock optical pulse train having the pulse repetition rate;
an optical bandpass filter configured to remove at least one frequency from the clock optical pulse train;
a photodetector configured to convert the clock optical pulse train to a clock electrical pulse train; and
an electrical filter configured to convert the clock electrical pulse train to the timing reference, the timing reference having at least one frequency that corresponds to the pulse repetition rate.

13. The analog-to-digital converter of claim 12, wherein:
the electrical filter is one of a bandpass filter or a low-pass filter; and
the timing reference has a single frequency that corresponds to the pulse repetition rate.

14. The analog-to-digital converter of claim 13, wherein the plurality of comparators are configured to trigger comparisons synchronously the timing reference.

15. The analog-to-digital converter of claim 12, wherein the number of bits for the digital signal, n, is a positive integer greater than or equal to one.

\* \* \* \* \*